United States Patent
Ono et al.

(10) Patent No.: US 6,284,640 B1
(45) Date of Patent: Sep. 4, 2001

(54) MANUFACTURING METHOD FOR SEMICONDUCTOR DEVICE, MOUNTING METHOD OF SEMICONDUCTOR DEVICE, SEMICONDUCTOR DEVICE, AND INSPECTING METHOD OF SEMICONDUCTOR DEVICE

(75) Inventors: Masahiro Ono; Tsukasa Shiraishi; Yoshihiro Bessho, all of Osaka; Kazuo Eda, Nara, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/427,807

(22) Filed: Oct. 27, 1999

(30) Foreign Application Priority Data

Oct. 29, 1998 (JP) .................................. 10-308180

(51) Int. Cl.[7] .................................................. H01L 21/44
(52) U.S. Cl. ............................................................ 438/617
(58) Field of Search ............................................ 438/617

(56) References Cited

U.S. PATENT DOCUMENTS

| | | | |
|---|---|---|---|
| 5,124,277 | * | 6/1992 | Tsumura ................................ 438/617 |
| 5,633,204 | * | 5/1997 | Tago et al. ............................ 438/614 |
| 5,686,353 | * | 11/1997 | Yagi et al. ............................ 438/617 |
| 5,994,152 | * | 11/1999 | Khandros et al. ..................... 438/617 |
| 5,994,212 | * | 11/1999 | Arakawa et al. ...................... 438/617 |
| 6,001,724 | * | 12/1999 | Stansbury ............................. 438/617 |

OTHER PUBLICATIONS

Publication (partial): 7th Electron Device Reliability Symposium; Nov. , 1997; pp. 89–94, "The effect of stud bumpoing about the MOSFETS on Device Reliability" by N. Shimoyama, et al., NTT System Electronics Laboratories.

Publication (partial): Electronics, Electronic Packaging Technology vol. 12, No 8. Aug., 1996; pp. 78–83, "Current Tendency of IC chip packaging technology" by Susan Honda, S.C. Laboratory.

\* cited by examiner

*Primary Examiner*—John F. Niebling
*Assistant Examiner*—Lynne A. Gurley
(74) *Attorney, Agent, or Firm*—Merchant & Gould PC (57) ABSTRACT

A manufacturing method for a semiconductor device using a wire bonding method using a metal wire. In the wire bonding method, an impact load applied when a metal ball formed at the tip of the metal wire by electric discharge is brought into contact with a terminal electrode of a semiconductor device is smaller than a static load applied after the metal ball is brought into contact with the terminal electrode. The method makes it possible to prevent an element or wiring from being damaged while securing the pressure necessary for bonding the metal ball to the terminal electrode even when the terminal electrode is placed on the element or the wiring.

21 Claims, 8 Drawing Sheets

(PRIOR ART)

MANUFACTURING METHOD FOR SEMICONDUCTOR DEVICE, MOUNTING METHOD OF SEMICONDUCTOR DEVICE, SEMICONDUCTOR DEVICE, AND INSPECTING METHOD OF SEMICONDUCTOR DEVICE

FIELD OF THE INVENTION

The present invention relates to a manufacturing method and a mounting method for a semiconductor device, which are capable of being performed even in a case where a terminal electrode (pad) for bonding is placed on an element or wiring.

BACKGROUND OF THE INVENTION

Recently, as portable type electronic equipment has become smaller and has had a higher performance, a semiconductor device, etc. has been required to have a small size and high performance. In order to meet these requirements, it is necessary to increase the number of terminal pins, to reduce the pitch or to make an area arrangement. In this case, however, there is a limit for reducing the pitch. In order to further reduce the pitch, it is important to mount a terminal electrode on an element or wiring as well.

According to such a mounting, when a bump is formed or mounted on the terminal electrode provided at the semiconductor side, if extremely high pressure is applied, the element inside the semiconductor device may be destroyed or cracks may occur in an insulating layer. Thus, an electric current leak occurs between the insulating layer and the wiring. For example, in a technique using a wire boding method, the impact load may damage the element or the wiring. Therefore, a technique where a terminal electrode is provided on the element or the wiring as well has not been established. Therefore, when the wire bonding method is used, it is necessary to form a terminal electrode outside the element or the wiring. Moreover, the wiring had to be drawn out of the semiconductor device.

Therefore, in the prior art in which the area bonding can be performed, the mounting technique is mainly based on a plating bump. Examples of such techniques include a mounting technique using a solder bump. The technique is developed by IBM Ltd. and generally called C4 (Controlled Collapse Chip Connection).

Figure 8:
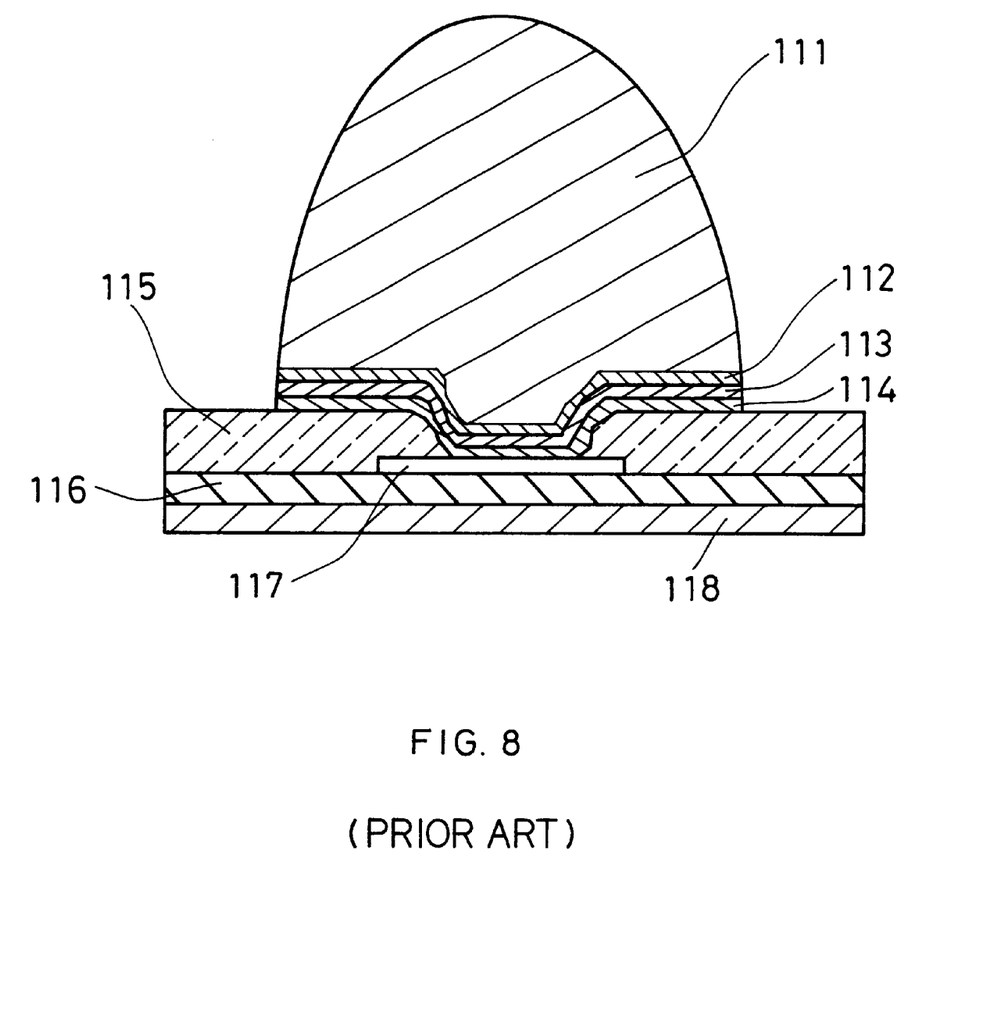
FIG. 8 is a schematic cross-sectional view of a bonding structure of a semiconductor device of a prior art.

FIG. 8 is a schematic cross-sectional view of a bonding structure of a semiconductor device of the above-mentioned mounting technique. An $SiO_2$ film 116 is formed on a substrate 118 and an Al terminal electrode 117 is formed on the $SiO_2$ film 116. On the terminal electrode 117, a solder bump 111 is formed via a glass protective film 115 and metal films 112, 113 and 114.

According to a literature "Mounting Technique of Electronics" (August (1996), pages 78–83), an aluminum oxide film is formed on the surface of aluminum that is a material of the terminal electrode 117 of an IC chip.

After removing this oxide film, the metal films, called barrier metals, 112, 113 and 114 are formed by vacuum evaporation, and then the solder bump 111 is formed. As a material for each film, for example, a Cu—Sn intermetallic compound for the metal film 112, a Cr—Cu alloy for the metal film 113 and Cr for the metal film 114 are used, respectively.

This solder bump 111 is brought into contact with an input/output terminal electrode of a circuit board and then reflow is performed. As a result, the solder bump 111 is melted and the bonding between the solder bump 111 and the input-output terminal of the circuit board is completed.

Moreover, the bump is not limited to the solder bump alone. An Au plating bump may be formed after the barrier metal is formed.

In these techniques, it is not necessary to apply load when the bump is formed. Therefore, in a case where the terminal electrode is formed on an active element of the IC chip, even if the bump is formed on the terminal electrode, the active element of the IC chip can be prevented from being damaged.

However, in these techniques, plating or treatments accompanying the plating are carried out. Therefore, a device for plating, a waste liquid treatment and a washing treatment, etc. are required, thus raising the manufacturing cost. In addition, it is necessary to cope with environmental problems, separately. Consequently, it has been difficult to put these techniques of the prior art into practical use as a consumer product.

As mentioned above, circuits of the semiconductor device have become finer. There was a problem in terms of securing an electrode for electric current to flow in such finer circuits. Furthermore, in a case where the electroless plating is performed, it is very difficult to unify the height of the bump, so that the reliability of the mounted body remains a problem.

SUMMARY OF THE INVENTION

It is therefore an object of the present invention to provide a manufacturing method and a mounting method for a semiconductor device, which are capable of preventing an element or wiring from being destroyed even if a wire bonding method is used, to provide a semiconductor device used for the above-mentioned methods, and to an inspecting method of a semiconductor device.

In order to achieve the above-mentioned object, the manufacturing method for a semiconductor device uses a wire bonding method using a metal wire, in the wire bonding method, an impact load applied when a metal ball formed at the tip of the metal wire by electric discharge is brought into contact with a terminal electrode of a semiconductor device is smaller than a static load applied after the metal ball is brought into contact with the terminal electrode. With such a manufacturing method for the semiconductor device, by making the impact load smaller than the static load, even when the terminal electrode is placed on an element or wiring, the element or the wiring can be prevented from being damaged while securing the pressure necessary for bonding the metal ball to the terminal electrode.

It is preferable in the above-mentioned manufacturing method of a semiconductor device that the metal ball is used for forming a bump.

Furthermore, it is preferable that the metal wire is used for bonding the terminal electrode of the semiconductor device to an input/output terminal electrode of a circuit board.

Furthermore, it is preferable that the terminal electrode is formed on an element or wiring provided inside the semiconductor device.

Furthermore, it is preferable that an ultrasonic wave is applied at least after the static load is applied. By applying an ultrasonic wave, the bonding between the metal ball and the terminal electrode can be stabilized.

Furthermore, it is preferable that the impact load per metal ball is 0.441 N or less, the static load is 0.981 N or less and the pressure applied to the terminal electrode after the static load is applied is 140 MPa or less.

Furthermore, it is preferable that the difference between the impact load per metal ball and the static load is 0.736 N or less.

Furthermore, it is preferable that the metal ball is formed of at least one metallic material selected from the group consisting of Au, Al, Pd, Pb, Sn, Cu, In, Bi, Ti and Ni.

Next, according to the mounting method for a semiconductor device of he present invention mounts a circuit board provided with a bump on an input/output terminal electrode to a semiconductor device by bonding the tip of the bump to the terminal electrode of the semiconductor device, wherein an impact load applied when the bump is brought into contact with the semiconductor device is smaller than a static load applied after the bump is brought into contact with the terminal electrode. With such a mounting method of the semiconductor device, by making the impact load smaller than the static load, even when the terminal electrode is placed on an element or the wiring, the element or wiring can be prevented from being damaged while securing the pressure necessary for bonding the metal ball to the terminal electrode.

It is preferable in the above-mentioned mounting method that the tip of the bump has a needle shape.

Furthermore, it is preferable that the needle-shaped portion comprises a flat portion having a diameter of 40 $\mu$m or less.

Furthermore, it is preferable that the tip of the bump has a spherical shape.

Furthermore, it is preferable that the terminal electrode of the semiconductor device is formed on the element or the wiring provided inside the semiconductor device.

Furthermore, it is preferable that an ultrasonic wave is applied at least after the static load is applied. By applying an ultrasonic wave, the bonding between the metal ball and the terminal electrode can be stabilized.

Furthermore, it is preferable that the impact load per metal ball is 0.441 N or less, the static load is 0.981 N or less, and the pressure applied to the terminal electrode after the static load is applied is 140 MPa or less.

Furthermore, it is preferable that the difference between the impact load per bump and the static load is 0.736 N or less.

Furthermore, it is preferable that the bump is formed by a wire bonding method and formed of at least one metallic material selected from the group consisting of Au, Al, Pd, Pb, Sn, Cu, In, Bi, Ti and Ni.

Furthermore, it is preferable that the bump is formed by plating and formed of at least one metallic material selected from the group consisting of Au, Al, Pd, Cu, Ni, Ti, Cr and Ag.

Furthermore, it is preferable that the bump is formed by a printing method and formed of at least one metallic material selected from the group consisting of Ag, Pd, Pt, Cu, Ni, Pb, Sn and Bi.

Next, according to the inspecting method for a semiconductor of the present invention, the method is used for a method for manufacturing a semiconductor device by the wire bonding method using metal wire, wherein a probe needle for inspection is brought into contact with a region on the terminal electrode other than a region in which the metal ball formed at the tip of the metal wire by electric discharge is bonded to the terminal electrode. With such an inspecting method of a semiconductor device, even if the probe needle is brought into contact with the terminal electrode and causes the loss of the terminal electrode made of e.g. aluminum, etc., the loss is not related to the region in which the bump is formed. Therefore, the stable bonding can be realized.

It is preferable in the above-mentioned inspecting method of a semiconductor device that the terminal electrode is formed on the element or the wiring inside the semiconductor device.

Next, the semiconductor device of the present invention is manufactured by the wire bonding method using a metal wire, comprising a region with which a probe needle for inspection is brought into contact, other than the region in which the metal ball formed at the tip of the metal wire by electric discharge is bonded to the terminal electrode formed on the semiconductor device. With such an inspecting method for a semiconductor device, even if the probe needle is brought into contact with the terminal electrode and causes the loss of the terminal electrode made of, e.g. aluminum, etc., the loss is not related to the region in which the bump is formed. Therefore, the stable bonding can be realized.

It is preferable in the above-mentioned semiconductor device that the terminal electrode is formed on the element or the wiring provided inside the semiconductor device.

DETAILED DESCRIPTION OF THE INVENTION

Hereinafter, the present invention will be described by way of embodiments with reference to drawings.

First Embodiment

Figure 1:
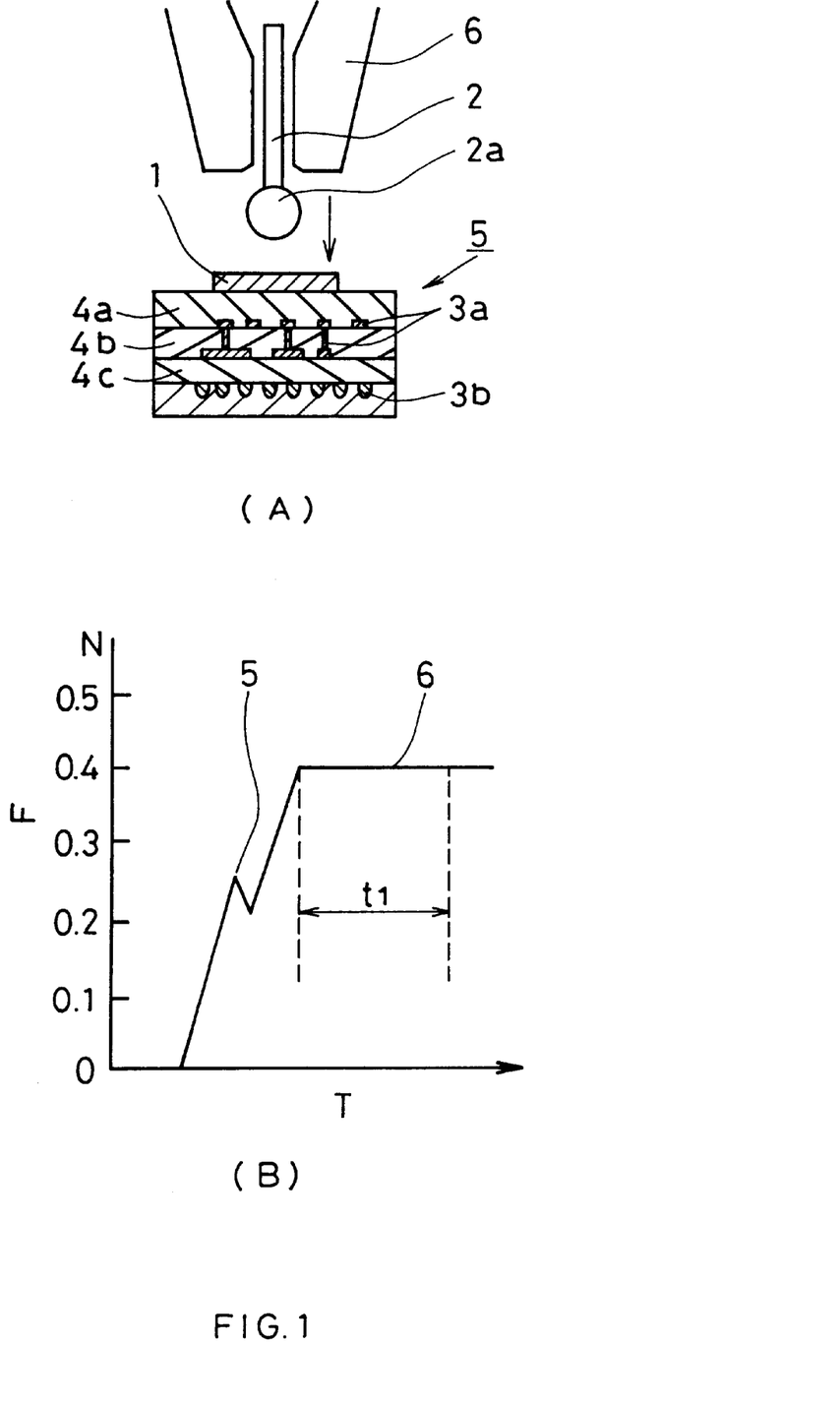
FIG. 1A is a schematic view showing a part of a method for forming a bump of a semiconductor device in a first embodiment according to the present invention.
FIG. 1B is a graph showing one example of a bonding process according to the present invention.

FIG. 1A is a schematic view showing a part of a method for forming a bump of a semiconductor device in a first embodiment of the present invention. In a semiconductor device 5 shown in FIG. 1A, three insulating layers 4a, 4b and 4c are formed on a substrate provided with an element 3b. In the insulating layers, wiring 3a is formed. On the insulating layer 4a, a terminal electrode 1 is formed. More specifically, in the semiconductor device 5 shown in FIG. 1, the terminal electrode 1 is formed on the element 3b and the wiring 3a provided inside the semiconductor device 5. The terminal electrode 1 is formed primarily of, for example, aluminum. Moreover, the element 3b is an active element such as a transistor, etc. or a passive element such as resistance, etc.

In this embodiment, a bump is formed on the terminal electrode 1 by the wire bonding method. As shown in FIG. 1A, at the tip of a metal wire 2, a metal ball 2a is formed by electric discharge. The metal ball 2a is formed primarily of, for example, Au. However, it may be formed of at least one metallic material selected from the group consisting of Au, Al, Pd, Pb, Sn, Cu, In, Bi, Ti and Ni.

The metal ball 2a is pressed against the terminal electrode 1 by a pressure tool 6. With this embodiment, the impact load is applied to the terminal electrode 1 when the metal ball 2a is pressed against. After the impact load is applied, sequentially the static load is applied. FIG. 1B shows one example of the bonding process. T of the abscissa shows time, F of the ordinate shows the magnitude of the load and t1 in FIG. 1B shows a time in which an ultrasonic wave is applied (the same is true in the following FIGS. 2C, 5B and 6B). In the example of this figure, the load per metal ball is 0.245 N (25 gram weight) for the impact load as shown by the remark 5 and 0.392 N (40 gram weight) for the static load as shown by the remark 6.

Main constituent factors related to the impact load include the speed when the metal ball is brought into contact with the terminal electrode, a detection load that is a reference with which the device detects that the metal ball is brought into contact with the terminal electrode, the size of the metal ball, and the like. In order to reduce the impact load, the speed is preferably small. Furthermore, the detection load is preferably small because load is applied until the load reaches to the reference load. In addition, as to the metal ball, especially for an Au ball that is soft, the larger the Au ball is, the greater the effect of relaxing the impact is. Therefore, it is preferable that the Au ball is large. After the impact load is applied, the static load is applied so as to stabilize the bonding property of the metal ball. In general, it is preferable that an ultrasonic wave is used together in order to secure the stability.

Herein, a state right after the metal ball 2a made of Au, etc. is brought into contact with the terminal electrode 1 is described. Until the metal ball 2a is sufficiently crushed, the contact area between the metal ball 2a and the terminal electrode 1 is small. Therefore, stress is tends to be concentrated on the contact portion, and thus a high pressure is applied thereto. Therefore, by reducing the impact load, the element 3b or the wiring 3a placed below the terminal electrode 1 can be prevented from being damaged. The load for bonding can be secured by making the static load applied after the impact load is applied larger than the impact load. When the impact load is applied, the metal ball 2a is sufficiently crushed. Therefore, even if the static load is increased, the pressure applied to the terminal electrode 1 can be reduced such that damage to the element 3b or the wiring 3a placed below the terminal electrode 1 can be prevented. Moreover, the damage herein denotes the deterioration of the property, the electric current leak due to the occurrence of cracks, or the like.

In other words, according to this embodiment, by making the impact load smaller than the static load, even if the terminal electrode is placed on the element or the wiring, the element or the wiring can be prevented from being damaged while securing the pressure necessary for bonding. Furthermore, since the technique of this embodiment does not require a washing process, the cost can be reduced. Further, it is not necessary to cope especially with environmental problems. Furthermore, since bonding to the terminal electrode on the element or the wiring is possible, the terminal electrode is not required to be formed outside the element or the wiring to thus enable a miniaturization of the device. Furthermore, since the wiring is not required to be drawn out of the device, the cost can be reduced and higher performance can be realized.

Hereinafter, this embodiment will be explained more specifically by way of the experiment results. Table 1 shows the conditions for bonding the Au ball to the terminal electrode. These conditions can be used for forming the bump and for performing the wire bonding method.

TABLE 1

| Condition | Search speed (mm/s) | Detection load (N) | Static load (N) | Output of ultrasonic wave (mW) | Time for applying ultrasonic wave (msec) | Ball size (μmφ) | Stage temperature (° C.) |
| --- | --- | --- | --- | --- | --- | --- | --- |
| (A) | 5 | 0.441 | 0.294 | 100 | 20 | 50 | 230 |
| (B) | 15 | 0.588 | 0.392 | 100 | 20 | 50 | 230 |
| (C) | 30 | 0.981 | 0.981 | 100 | 20 | 50 | 230 |
| (D) | 5 | 0.441 | 0.294 | 200 | 20 | 50 | 230 |

The impact load depends upon the speed when the Au ball is brought into contact with the terminal electrode (hereinafter, "search speed" will be referred to) and the detection load. When the search speed is large, even if the device detects the detection load, the control for inhibiting the load does not follow. Therefore, actually, load greater than the detection load is applied to the terminal electrode. In this case, the load greater than the detection load is an impact load. When the impact load is actually measured under the conditions (A), (B) and (C) of Table 1, the measurement results shown in Table 2 were obtained.

TABLE 2

| Condition | (A) | (B) | (C) |
| --- | --- | --- | --- |
| Impact load | 0.441N | 0.735N | 1.961N |

The impact load shown in Table 2 was measured by using a pressure sensor. As shown in Table 2, as in the conditions (A) where the search speed is as relatively low as 5 mm/s, the impact load is equal to the detection load. On the contrary, as in the condition (C) where the search speed is as high as 30 mm/s, the detection load is 0.981 N (100 gram weight) while the actual impact load is 1.961N (200 gram weight) that is much larger than the detection load.

Table 3 shows the results of qualities evaluated under the conditions (A) to (D) of Table 1.

TABLE 3

| Condition | (A) | (B) | (C) | (D) |
|---|---|---|---|---|
| Al wiring leak | 0/192 | 0/192 | 1/64 | 0/128 |
| Nch MOS Tr property deterioration | 0/54 | 3/54 | — | 2/54 |

The "Al wiring leak" of the measurement item of Table 3 shows results of whether or not the electric current leak occurs due to the occurrence of cracks by bonding between the Al wiring 3a and the terminal electrode 1 (the distance between them: 1 $\mu$m). The insulating layer is an SiO$_2$ layer.

Another measurement item, "Nch MOS Tr property deterioration" shows results of whether or not the deterioration of the threshold value or electric current leak occurs due to the bonding when the terminal electrode is placed on the Nch MOS transistor. The insulating layer is an SiO$_2$ layer. Moreover, the distance between the terminal electrode and the Nch MOS transistor is 4.97 $\mu$m. Among the written numerical values in Table 3, the numerical values of the right side show the number of samples and those of the left side show the number of defectives.

The results in Table 3 show that even if the static load is small, if the impact load per bump is 0.735 N (75 gram weight) or more, the property deterioration is easily caused by the stress concentration (conditions (B) and (C)). Furthermore, Table 3 also shows that in the range where the impact load is up to 0.441 N (45 gram weight), there is no problem (condition (A)).

Furthermore, the comparison between the condition (A) and the condition (B) shows that the effect by the energy propagation by the ultrasonic wave is not negligible. Therefore, it is preferable that ultrasonic wave is used at the energy of 100 mW or less and for about 20 msec.

Next, other experiment results are shown. They are obtained when experiments were carried out while changing conditions. Table 4 shows the bonding conditions.

TABLE 4

| Condition | Search speed (mm/s) | Detection load (N) | Static Load (N) | Output of ultrasonic wave (mW) | Time of applying ultrasonic wave (msec) | Ball size ($\mu$m$\phi$) | Stage temperature (° C.) |
|---|---|---|---|---|---|---|---|
| (E) | 5 | 0.196 | 0.294 | 60 | 20 | 52~55 | 260 |
| (F) | 15 | 0.490 | 0.392 | 85 | 20 | 52~55 | 260 |
| (G) | 20 | 0.588 | 0.392 | 85 | 20 | 52~55 | 260 |
| (H) | 50 | 0.981 | 0.981 | 85 | 20 | 52~55 | 260 |

Table 5 shows the results of qualities evaluated under the conditions (E) to (H) of Table 4.

TABLE 5

| Condition | (E) | (F) | (G) | (H) |
|---|---|---|---|---|
| Al wiring leak | 0/320 | 0/320 | 0/320 | 3/30 |

As shown in the results of Table 5, defectives occurred only under the condition (H). Herein, the condition (G) is similar to the condition (B). Consequently, it is shown that when the impact load is reduced to some extent, the occurrence of defectives can be inhibited.

Next, the experiment results are shown with respect to the various kinds of devices. Table 6 shows the results when the bonding was performed in a case where the terminal electrode is formed on the Nch MOS transistor.

TABLE 6

[The terminal electrode is formed on an Nch MOS transistor.]

| | Search speed (mm/s) | Stage temperature (° C.) | Static load (N/bump) | Output of ultrasonic wave (mW) | Change of threshold voltage |
|---|---|---|---|---|---|
| 1 | 5 | 330 | 0.049~0.981 | 40 | 1.0% or less |
| 2 | 10 | 330 | 0.196~0.392 | 40 | 1.2% or less |
| 3 | 20 | 330 | 0.196~0.392 | 40 | 1.0% or less |
| 4 | 20 | 200 | 0.196~0.392 | 40 | 1.2% or less |
| 5 | 20 | 150 | 0.196~0.981 | 40~100 | 0.6% or less |

Table 7 shows the results when the bonding was performed in a case where the terminal electrode is provided on a Pch MOS transistor.

TABLE 7

[The terminal electrode is formed on the Pch MOS transistor.]

| | Search speed (mm/s) | Stage temperature (° C.) | Static load (N/bump) | Output of ultrasonic wave (mW) | Change of threshold voltage |
|---|---|---|---|---|---|
| 6 | 5 | 330 | 0.049~0.588 | 40 | 0.3% or less |

Table 8 shows the results when the bonding was performed in a case where the terminal electrode is provided on a SRAM transistor.

TABLE 8

[The terminal eleetrode is provided on a SRAM transistor.]

| | Search speed (mm/s) | Stage temperature (° C.) | Static load (N/bump) | Output of ultrasonic wave (mW) | Bit error |
|---|---|---|---|---|---|
| 7 | 5 | 330 | 0.049~0.588 | 40 | 0/228 |

Table 9 shows the results when the bonding was performed in a case where the terminal electrode is provided on the Al wiring.

TABLE 9

[The terminal electrode is provided on Al wiring.]

| | Search speed (mm/s) | Stage temperature (° C.) | Static load (N/bump) | Output of ultrasonic wave (mW) | Electric current leak |
|---|---|---|---|---|---|
| 8 | 5 | 330 | 0.049~0.392 | 40 | Each 0/32 |
| 9 | 10 | 330 | 0.196~0.392 | 40 | Each 0/16 |
| 10 | 20 | 330 | 0.196~0.392 | 40 | Each 0/16 |
| 11 | 20 | 200 | 0.196~0.392 | 40 | Each 0/16 |
| 12 | 20 | 150 | 0.196~0.981 | 40~100 | Each 0/16 |

When the terminal electrode is formed on the element, the distance between the terminal electrode and the element is 4.97 μm. When the terminal electrode is formed on the Al wiring, the distance between the terminal electrode and the Al wiring is 1 μm.

The conditions common to the experiments shown in Tables 6 to 9 include: the detection load per bump of 0.245 N (25 gram weight); the time of applying ultrasonic wave of 15 msec; and the diameter of the Au ball of about 69 μm. In all cases, an ultrasonic wave is applied at the same time the static load is applied. Moreover, there is no problem as long as the ultrasonic wave is applied at least after the static load is applied.

As is apparent from the results of Tables 6 to 9, all samples have no property deterioration or no electric current leak, showing the excellent results. More specifically, if the static load is inhibited to some extent, there arises no problems even if the static load per bump that is applied after the impact load is applied is 0.981 N (100 gram weight) and the ultrasonic wave is 100 mW.

Next, the shape of the bump and pressure applied to the terminal electrode were measured while changing the static load. The measurement results are described as follows. The measurement conditions are shown in Table 10.

TABLE 10

| Condition | Search speed (mm/s) | Detection load (N) | Static load (N) | Output of ultrasonic wave (mW) | Time of applying wave (msec) | Ball size (μmφ) | Stage temperature (° C.) |
|---|---|---|---|---|---|---|---|
| | 5 | 0.245 | 0.245~1.373 | 40 | 20 | about 69 | 330 |

Figure 2:
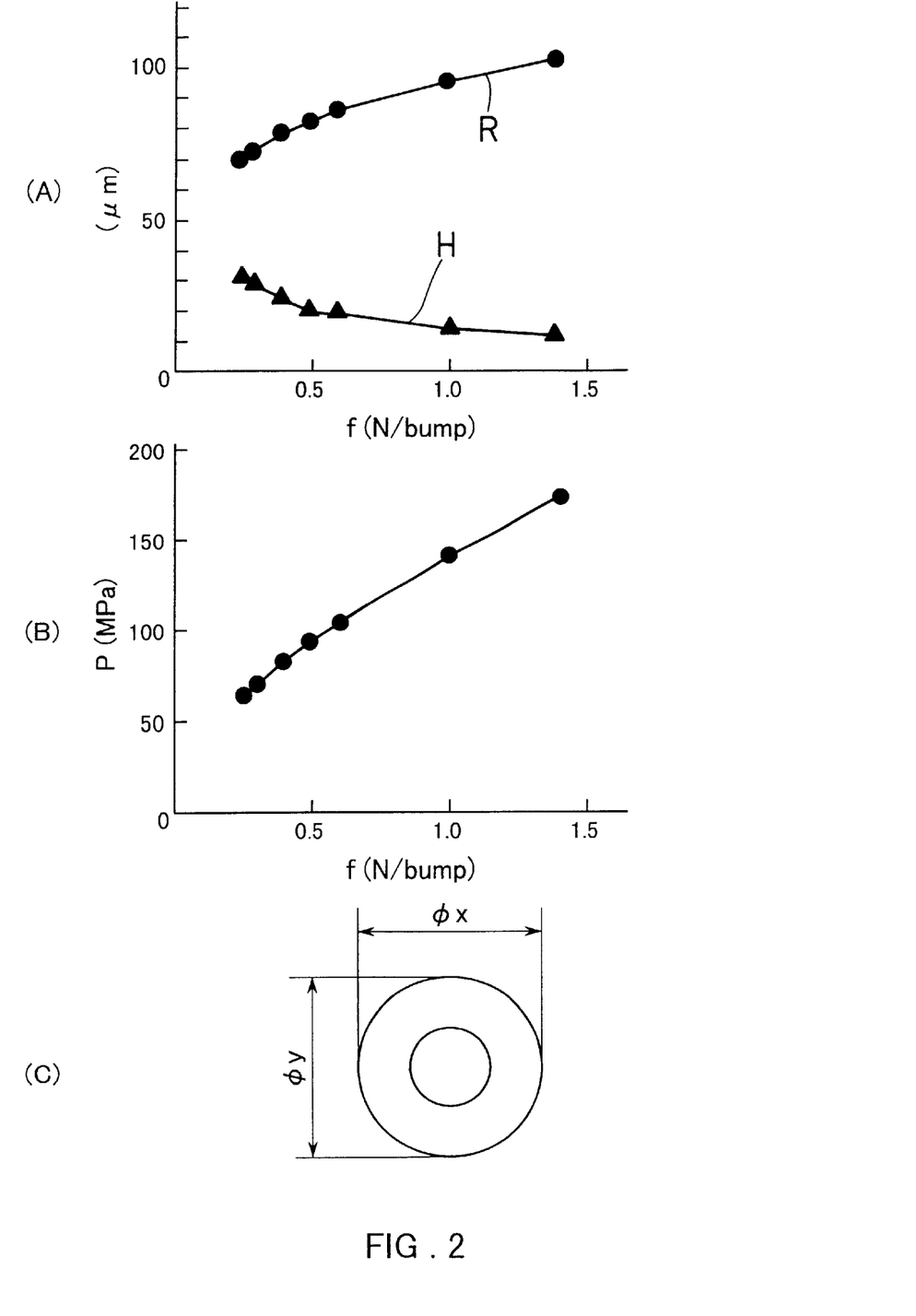
FIG. 2A is a graph showing a relationship between the static load f, the diameter R of a seating and the height H of a seating according to the present invention.
FIG. 2B is a graph showing a relationship between a static load f and pressure P applied to a terminal electrode according to the present invention.
FIG. 2C shows a diameter of a seating according to the present invention.

The lower part of the bump, which was obtained after the Au ball was deformed and the static load was applied thereto, is referred to as a seating. FIG. 2 A is a graph showing a relationship between the static load f, the diameter R of the seating and the height H of the seating. FIG. 2B is a graph showing a relationship between the static load f and the pressure P applied to the terminal electrode. The pressure applied to the terminal electrode can be calculated from the area of the seating and the static load. More specifically, as shown in FIG. 2C, the average diameter R of the seating is expressed by the following equation (1) and the average radius r of the seating is expressed by the following equation (2). In the equations (1) and (2), φx and φy denote diameters of the seating, respectively.

$$R = (\phi x + \phi y)/2 \quad \text{equation (1)}$$

$$r = R/2 \quad \text{equation (2)}$$

When the pressure P is expressed by the following equation (3):

$$P = f/\pi r^2 \quad \text{equation (3)}$$

wherein f denotes the static load and P denotes the pressure applied to the terminal electrode.

It is preferable that the pressure applied to the terminal electrode after the static load is applied is up to 140 MPa corresponding to the pressure when the static load per bump is 0.981 N (100 gram weight).

As mentioned in the experiment results, it is preferable that the device is used under the conditions of: the impact load per bump of 0.441N (45 gram weight) or less, the static load of 0.981 N (100 gram weight) or less; the ultrasonic wave of 100 mW or less; and the pressure applied to the terminal electrode after the static load is applied of up to 140 MPa corresponding to the pressure when the static load per bump is 0.981 N (100 gram weight). Furthermore, there is no problem as long as the impact load is secured to be 0.245 N (25 gram weight). As mentioned above, it is preferable that the impact load is 0.981 N or less. Therefore, it is preferable that the difference between the impact load per metal ball and the static load is 0.736 N (75 gram weight).

Second Embodiment

Figure 3:
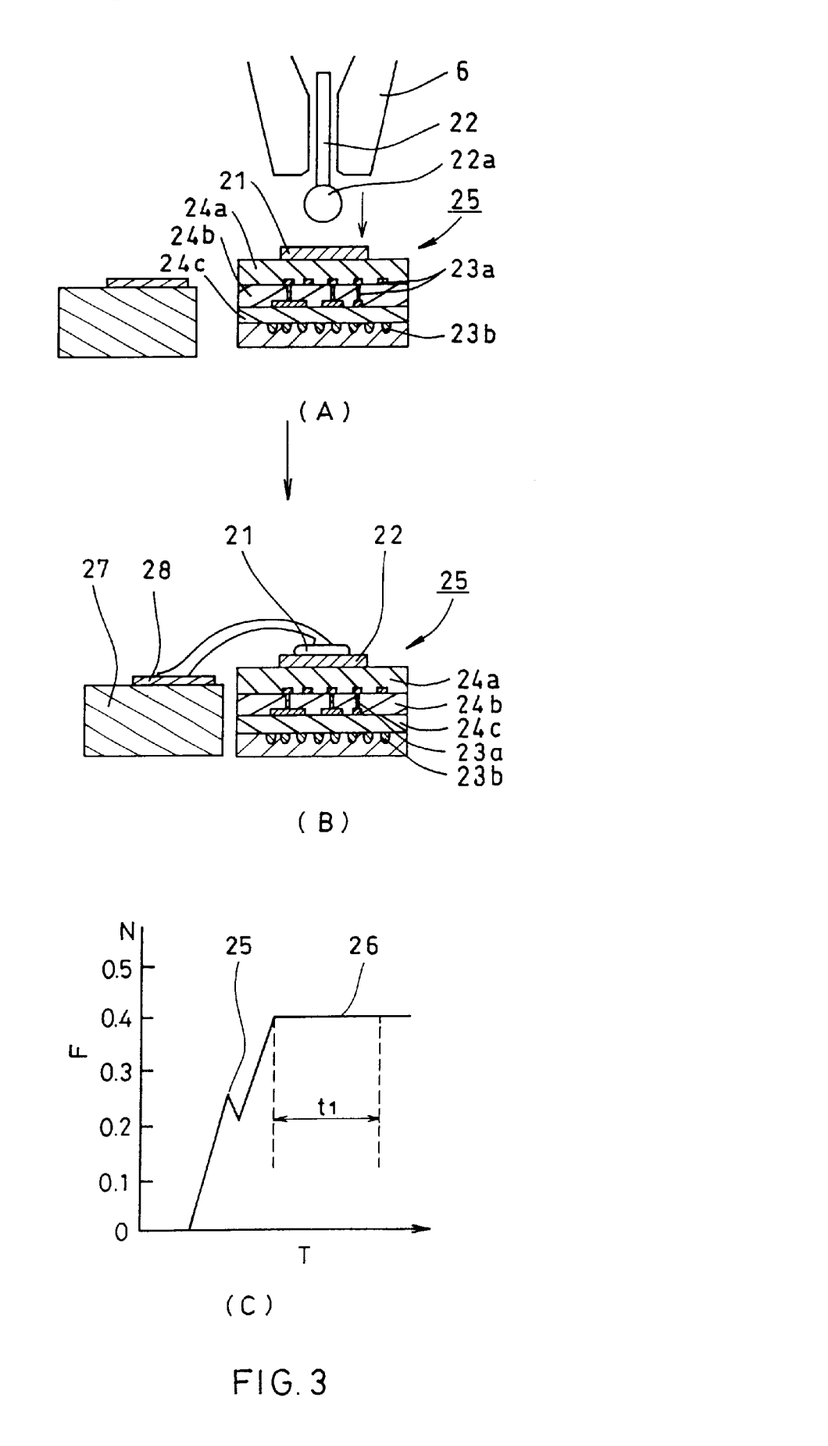
FIG. 3A is a cross-sectional view showing a state right before an impact load is applied to a terminal electrode by wire bonding according to the present invention.
FIG. 3B is a cross-sectional view showing a state when a terminal electrode is bonded to an input/output terminal electrode by a metal wire according to the present invention.
FIG. 3C is a graph showing one example of a bonding process according to the present invention.

FIGS. 3A and B are schematic views showing a bonding process when wire bonding is performed on a terminal electrode of a semiconductor device. In a semiconductor device 25 shown in FIG. 3A, three insulating layers 24a, 24b and 24c are formed on a substrate provided with an element 23b. In the insulating layers, wiring 23a is formed. On the insulating layer 24a, a terminal electrode 21 is formed. More specifically, in the semiconductor device 25 shown in FIG. 3, the terminal electrode 21 is formed on the element 23b and the wiring 23a provided inside the semiconductor device 25. The terminal electrode 21 is formed primarily by, for example, aluminum. Furthermore, the element 23b is an active element such as a transistor, etc. or a passive element such as resistance, etc.

As shown in FIG. 3A, at the tip of a metal wire 22, a metal ball 22a is formed by electric discharge. The metal ball 22a is formed primarily of, for example, Au. However, it may be formed of at least one metallic material elected from the group consisting of Au, Al, Pd, Pb, Sn, Cu, In, Bi, Ti and Ni.

The metal ball 22a is pressed against the terminal electrode 21 by a ressure tool 6. With this embodiment, the impact load is applied to the terminal electrode 21 when the metal ball 22a is pressed against, and sequentially the static electrode is applied. FIG. 3C shows one example of the bonding process. In the example of this figure, the load per metal ball is 0.245 N (25 gram weight) for the impact load as shown by the remark 25 and 0.392 N (40 gram weight) for the static load as shown by the remark 26.

Also in this embodiment, for the same reason as in the first embodiment, the impact load is set to be smaller than the static load, whereby the element 23b or the wiring 23a placed below the terminal electrode 21 can be prevented from being damaged. Furthermore, it is generally preferable that an ultrasonic wave is used together in order to secure the stability. Herein, the damage denotes the deterioration of property, the electric current leak due to the occurrence of cracks, or the like.

Furthermore, as shown in FIG. 3B, the tip opposed to the metal ball 22a of the metal wire 22 is bonded to an input/output terminal electrode 28 of the circuit board 27.

Similar to the first embodiment, also in the second embodiment, it is preferable that the device is used under the conditions of: the impact load per bump of 0.441N (45 gram weight) or less; the static load of 0.981 N (100 gram weight) or less; ultrasonic wave of 100 mW or less; and the pressure applied to the terminal electrode after the static load is applied of up to 140 MPa corresponding to the pressure when the static load per bump is 0.981 N (100 gram weight). Furthermore, there is no problem as long as the impact load is secured to be 0.245 N (25 gram weight). As mentioned above, it is preferable that the impact load is 0.981 N or less. Therefore, it is preferable that the difference between the impact load per metal ball and the static load is 0.736 N (75 gram weight).

Third Embodiment

Figure 4:
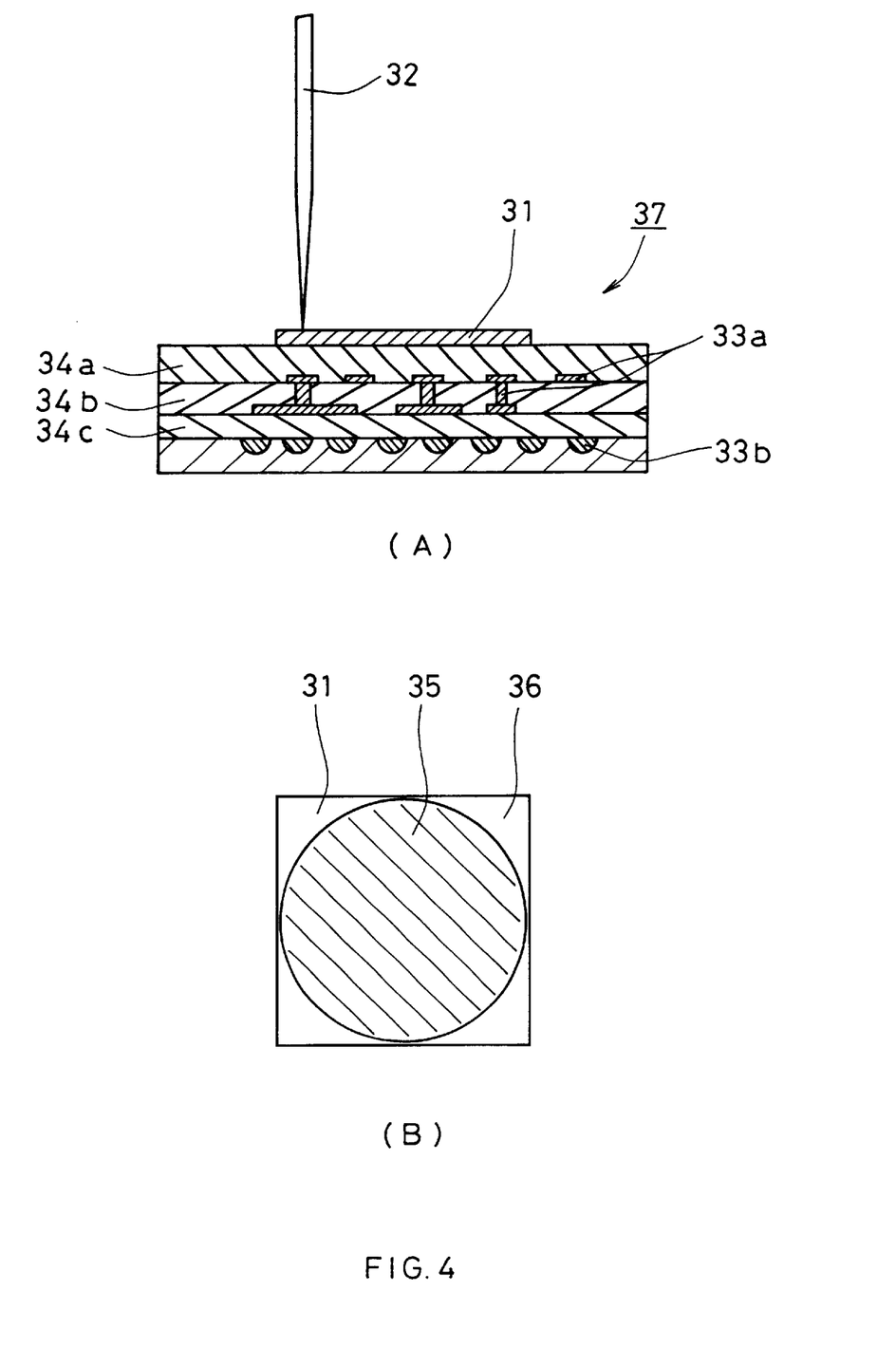
FIG. 4A is a schematic cross-sectional view showing a method for inspecting a semiconductor device in a third embodiment according to the present invention.
FIG. 4B is a view showing one example of a square-shaped terminal electrode seen from above in the third embodiment according to the present invention.

The third embodiment of the present invention relates to a method for inspecting a semiconductor device. FIG. 4 is a schematic view showing a method for inspecting a semiconductor device of this embodiment. FIG. 4A is a cross-sectional view of a semiconductor device, and FIG. 4B is a view of a semiconductor device seen from above.

In a semiconductor device 37 shown in FIG. 4 A, three insulating layers 34a, 34b and 34c are formed on a substrate provided with an element 33b. In the insulating layers, wiring 33a is formed. On the insulating layer 34a, a terminal electrode 31 is formed. More specifically, in the semiconductor device 37, the terminal electrode 31 is formed on the element 33b and the wiring 33a provided inside the semiconductor device 37.

FIG. 4A shows a state before the wire bonding is carried out on the terminal electrode 31 or before the bump is formed by the wire bonding method.

FIG. 4B shows an example of the terminal electrode 31 having a square shape that is a general shape of the terminal electrode. However, the shape of the terminal electrode is not limited to a square shape alone. The terminal electrode 31 is formed primarily of aluminum. The hatched part of the terminal electrode 31 shows the region in which the metal ball is bonded.

Since a bonding region 35 of the metal ball is thought to be similar to a circular shape, the corner region 36 of the terminal electrode 31 is a region that is not related to the bonding. If the bonding region 35 of the metal ball is inspected by bringing a probe needle 32 into contact with the bonding region 35 in advance, the loss of aluminum occurs because of the contact.

When the bonding is performed later, an intermetallic compound of the metal ball and the terminal electrode (primarily aluminum) is generated, thus inhibiting the stability of the bonding.

In this embodiment, the region in which the probe needle 32 for inspection is in contact with a corner region 36 of the terminal electrode 31, which is not related to the bonding region 35 of the metal ball. Therefore, in the bonding region 35, there is no loss of aluminum caused by the contact of the prove needle 32, thus enabling the stable bonding connection.

Fourth Embodiment

Figure 5:
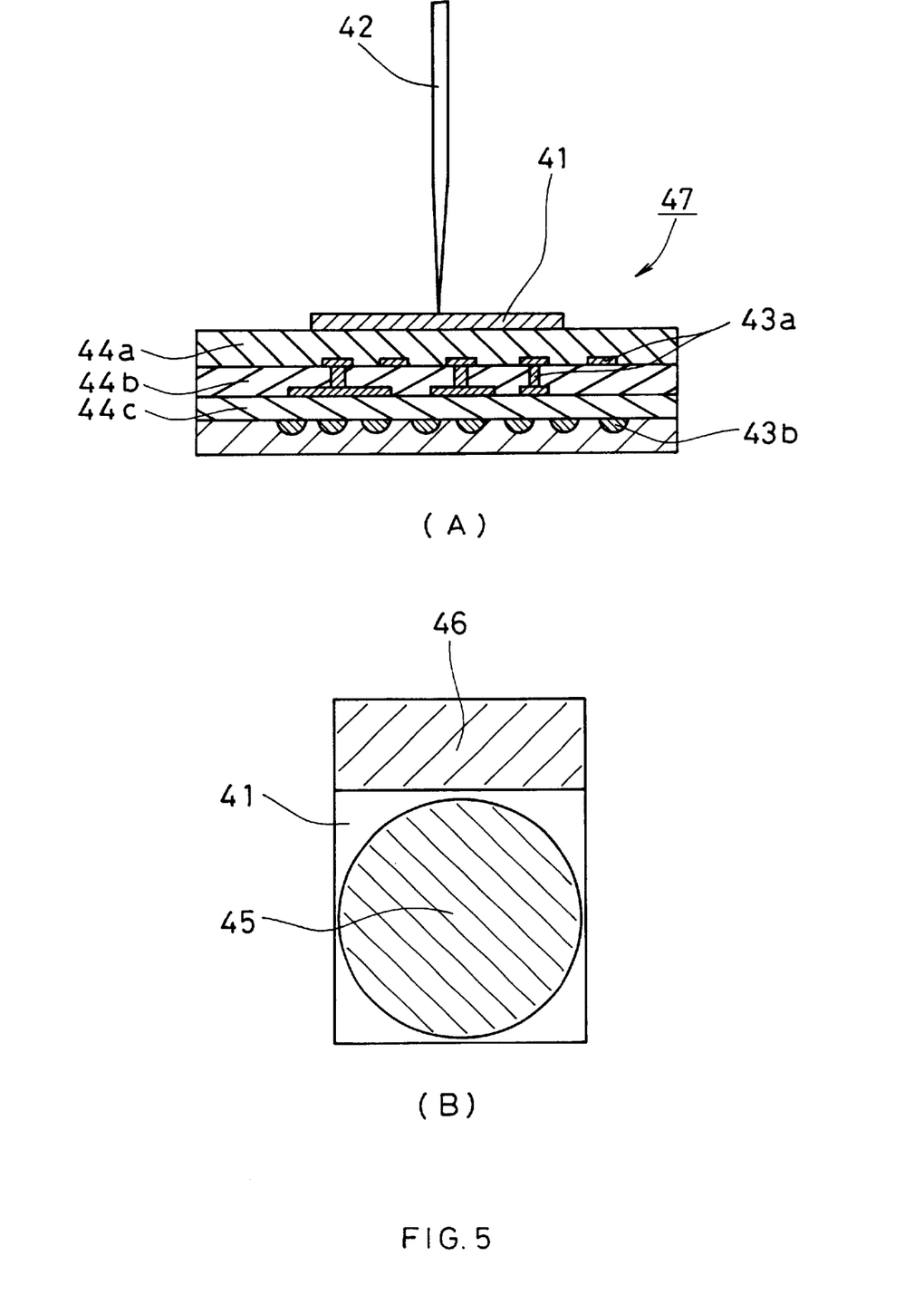
FIG. 5A is a cross-sectional view of a semiconductor device in a fourth embodiment according to the present invention.
FIG. 5B is a view of a semiconductor seen from above in the fourth embodiment according to the present invention.

The fourth embodiment of the present invention relates to a semiconductor device suitable for the inspection when the wire bonding is carried out or the bump is formed by the wire bonding method. FIG. 5A is a cross-sectional view of a semiconductor device according to this embodiment; and FIG. 5B is a view of a semiconductor seen from above.

In a semiconductor device 47 shown in FIG. 5A, three insulating layers 44a, 44b and 44c are formed on a substrate provided with an element 43b. In the insulating layers, the wiring 43a is formed. On the insulating layer 44a, a terminal electrode 41 is formed. More specifically, in the semiconductor device 47, the terminal electrode 41 is formed on the element 43b and the wiring 43a provided inside the semiconductor device 47.

FIG. 5A shows a state before the wire bonding is carried out on the terminal electrode 41 or before the bump is formed by the wire bonding method. FIG. 5B shows an example of the terminal electrode 41 having a rectangular shape. The terminal electrode 41 is formed primarily of aluminum. The bonding region 45 shown by a hatched part of the terminal electrode 41 shows the region in which the metal ball is bonded. A bonding region of the metal ball is thought to be similar to a circular shape.

In this embodiment, an inspection region 46 is provided on the terminal electrode 41. When the probe needle 42 is brought into contact with the bonding region 45 of the metal ball in advance, the loss of aluminum occurs due to the contact. When the bonding is performed later, an intermetallic compound is generated between the metal ball and the terminal electrode (primarily aluminum), thus inhibiting the stability of the bonding.

In this embodiment, the contact region of the probe needle 42 is provided separately from the bonding region 45 of the metal ball. Therefore, the stable bonding connection is possible.

Fifth Embodiment

Figure 6:
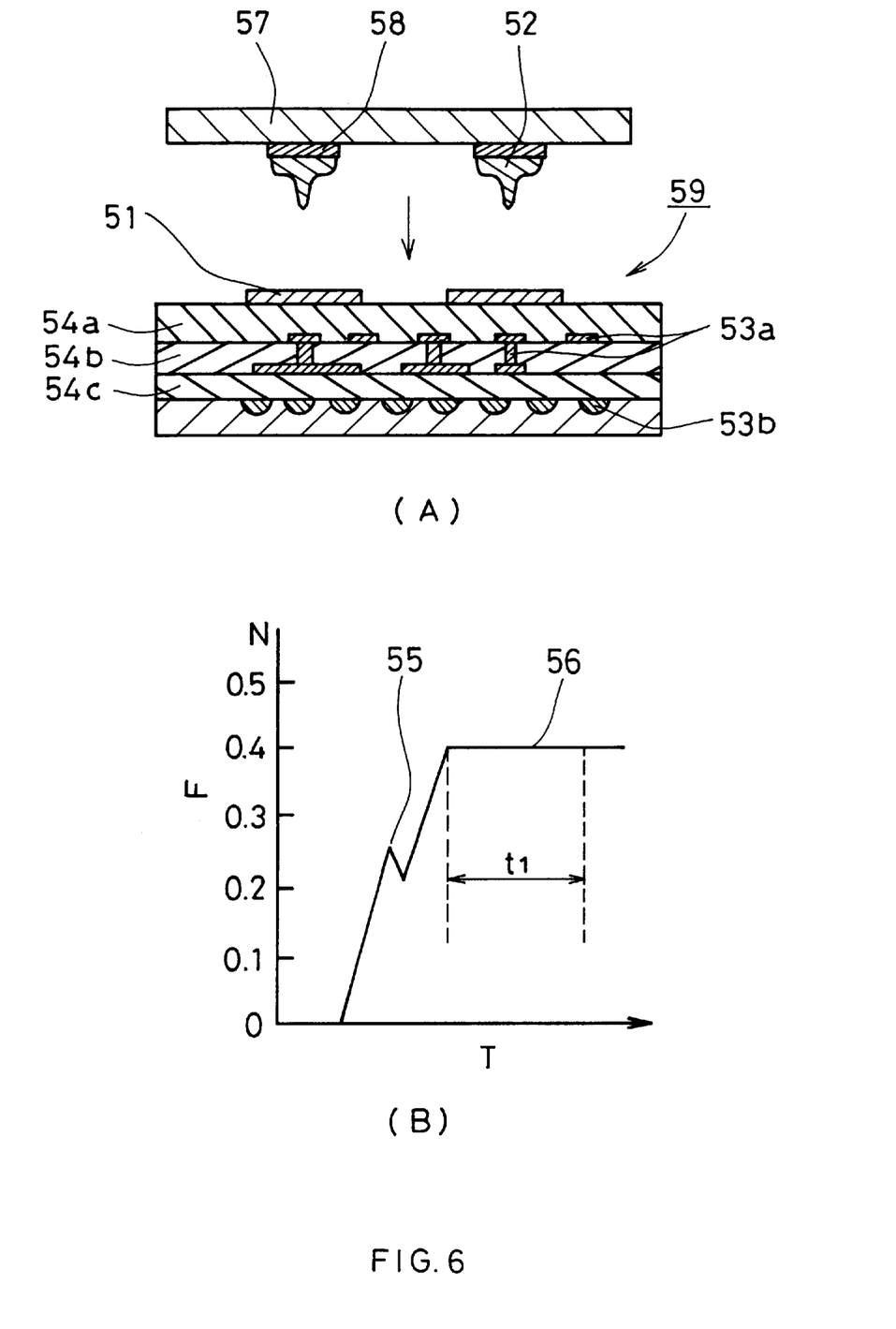
FIG. 6A is a schematic cross-sectional view showing a mounting process for a semiconductor in a fifth embodiment according to the present invention.
FIG. 6B is a graph showing one example of a bonding process according to the present invention.

FIG. 6A is a schematic view showing a mounting process for a semiconductor according to a fifth embodiment of the present invention. In a semiconductor device 59 shown in FIG. 6 A, three insulating layers 54a, 54b and 54c are formed on a substrate provided with an element 53b. In the insulating layers, wiring 53a is formed. On the insulating layer 54a, a terminal electrode 51 is formed. More specifically, in the semiconductor device 59, the terminal electrode 51 is formed on the element 53b and the wiring 53a provided inside the semiconductor device 59. The element 53b is an active element such as a transistor, etc. or a passive element such as resistance, etc.

On an input/output terminal electrode 58 of a circuit board 57 shown in FIG. 6A, a bump 52 having a needle-shaped tip is formed. The bump 52 is bonded to the terminal electrode 51 of the semiconductor electrode 59. The bump 52 can be formed in a shape of a needle having a diameter of a tip flat portion of 40µm or less on the input/output terminal electrode 58 of the circuit board 57 by, for example, the wire bonding method.

It is preferable that when the bump 52 is formed by the wire bonding method, it is formed of at least one metallic material selected from the group consisting of Au, Al, Pd, Pb, Sn, Cu, In, Bi, Ti and Ni. It is further preferable that when the bump 52 is formed by plating, it is formed of at least one metallic material selected from the group consisting of Au, Al, Pd, Cu, Ni, Ti, Cr and Ag. It is still further preferable that when the bump 52 is formed by a printing method, it is formed of at least one metallic material selected from the group consisting of Ag, Pd, Pt, Cu, Ni, Pb, Sn and Bi.

The circuit board 57 moves in the direction shown by the arrow in FIG. 6A, and then the bump 52 is pressed against the terminal electrode 51. Consequently, the impact load is applied to the terminal electrode 51 when the bump 52 is pressed. After the impact load is applied, sequentially the static load is applied. FIG. 6B shows one example of the bonding process. In the example of this figure, the load per metal ball is 0.245 N (25 gram weight) for the impact load as shown by the remark 55 and 0.392 N (40 gram weight) for the static load as shown by the remark 56.

Main constituents factors related to the impact load include the speed when the metal ball is brought into contact with the terminal electrode, the detection load that is a reference with which the device detects that the metal ball is brought into contact with the terminal electrode, the size of the metal ball, and the like. In order to reduce the impact load, the speed is preferably small. Furthermore, the detection load is preferably small because the load is applied until the load reaches to a target load.

Furthermore, as to the flat portion at the tip of the bump, the larger the flat portion is, the smaller the stress is. Therefore, the flat portion at the tip is preferably large. More specifically, it is preferable that the diameter of the flat portion is as large as possible in the range of 40 μm or less.

After the impact load is applied, the static load is applied so as to stabilize the bonding property of the bump. In general, it is preferable that the ultrasonic wave is used together in order to secure the stability.

This mounting process can be employed in any mounting methods that require pressure. For example, it may be employed in the case where the ultrasonic wave is used together to perform a pressure welding the bump. Furthermore, it may be employed in the mounting via a connecting layer such as conductive paste, an anisotropic conductive film, etc.

Herein, the state right after the bump 52 is brought into contact with the terminal electrode 51 is described. Until the bump 52 is sufficiently crushed, the contact area between the bump 52 and the terminal electrode 51 is small. Therefore, stress tends to be concentrated on the contact portion, and thus a high pressure is applied thereto. Therefore, by reducing the impact load, the element 53b or the wiring 53a placed below the terminal electrode 51 can be prevented from being damaged. The load for bonding can be secured by making the static load applied after the impact load is applied larger than the impact load. When the impact load is applied, the bump 52 is sufficiently crushed, even if the static load is increased, the pressure applied to the terminal electrode 51 can be reduced such that damage to the element 53b or the wiring 53a placed below the terminal electrode 51 can be prevented. Herein, the damage denotes the deterioration of the property, the electric current leak due to the occurrence of cracks, or the like.

Furthermore, in the mounting process according to this embodiment, the experiment results described in the first embodiment can be employed. Therefore, it is preferable that the impact load per bump is 0.441N (45 gram weight) or less, the static load is 0.981 N (100 gram weight) or less; the ultrasonic wave is 100 mW or less; and the pressure applied to the terminal electrode after the static load is applied is up to 140 MPa corresponding to the pressure when the static load per bump is 0.981 N (100 gram weight). Furthermore, there is no problem as long as the impact load is secured to be 0.245 N (25 gram weight). As mentioned above, it is preferable that the impact load is 0.981 N or less. Therefore, it is preferable that the difference between the impact load per metal ball and the static load is 0.736 N (75 gram weight).

Sixth Embodiment

Figure 7:
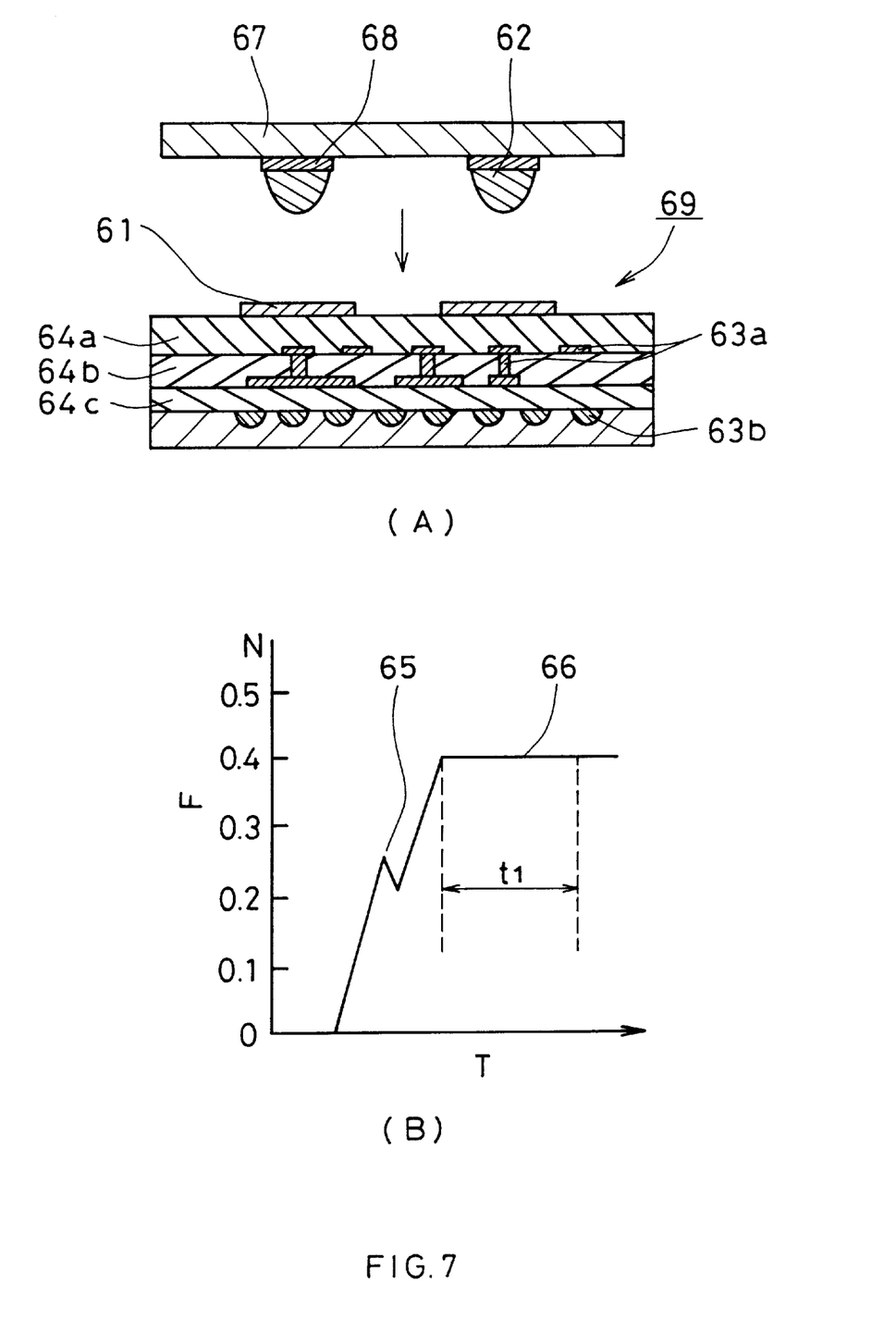
FIG. 7A is a schematic cross-sectional view showing a mounting process of a semiconductor device in a sixth embodiment according to the present invention.
FIG. 7B is a graph showing one example of a bonding process according to the present invention.

FIG. 7A is a schematic view showing a mounting process for a semiconductor device according to a sixth embodiment of the present invention. In a semiconductor device 69 shown in FIG. 7A, three insulating layers 64a, 64b and 64c are formed on a substrate provided with an element 63b. In the insulating layers, wiring 63a is formed. On the insulating layer 64a, a terminal electrode 61 is formed. More specifically, in the semiconductor device 69, the terminal electrode 61 is formed on the element 63b and the wiring 63a provided inside the semiconductor device 69. The element 63b is an active element such as a transistor, etc. or a passive element such as resistance, etc.

The sixth embodiment is different from the fifth embodiment in that the bump 62 has a spherical-shaped tip. Such a bump 62 having a spherical-shaped tip can be formed by, for example, plating. The material of the bump 62 is the same as that in the fifth embodiment.

The method for mounting the semiconductor device 69 to the circuit board 67 in this embodiment is the same as that of the fifth embodiment. In other words, also in this embodiment, by making the impact load smaller than the static load, damage to the element 63b or the wiring 63a placed below the terminal electrode 61 can be prevented.

FIG. 7B shows one example of the bonding process. In the example of this figure, the load per bump is 0.245 N (25 gram weight) for the impact load as shown by the remark 65 and 0.392 N (40 gram weight) for the static load as shown by the remark 66.

Furthermore, also in the mounting process according to this embodiment, the experiment results described in the first embodiment can similarly be employed. Therefore, as mentioned in the experiment results, it is preferable that the device is used under the conditions of: the impact load per bump of 0.441N (45 gram weight) or less, the static load of 0.981 N (100 gram weight) or less; ultrasonic wave of 100 mW or less; and the pressure applied to the terminal electrode after the static load is applied of up to 140 MPa corresponding to the pressure when the static load per bump is 0.981 N (100 gram weight). Furthermore, there is no problem as long as the impact load is secured to be 0.245 N (25 gram weight). As mentioned above, it is preferable that the impact load is 0.981 N or less. Therefore, it is preferable that the difference between the impact load per metal ball and the static load is 0.736 N (75 gram weight).

The invention may be embodied in other specific forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A manufacturing method for a semiconductor device using a wire bonding method using a metal wire, wherein in said wire bonding method, an impact load applied when a metal ball formed at the tip of said metal wire by electric discharge is brought into contact with a terminal electrode of a semiconductor device is smaller than a static load applied after said metal ball is brought into contact with said terminal electrode.

2. The method for manufacturing a semiconductor device according to claim 1, wherein said metal ball is used for forming a bump.

3. The method for manufacturing a semiconductor device according to claim 1, wherein said metal wire is used for bonding the terminal electrode of the semiconductor device to an input/output terminal electrode of a circuit board.

4. The method for manufacturing a semiconductor device according to claim 1, wherein said terminal electrode is formed on an element or wiring provided inside said semiconductor device.

5. The method for manufacturing a semiconductor device according to claim 1, wherein an ultrasonic wave is applied at least after said static load is applied.

6. The method for manufacturing a semiconductor device according to claim 1, wherein the impact load per said metal ball is 0.441 N or less, the static load is 0.981 N or less and the pressure applied to said terminal electrode after said static load is applied is 140 MPa or less.

7. The method for manufacturing a semiconductor device according to claim 1, wherein the difference between the impact load per said metal ball and said static load is 0.736 N or less.

8. The method for manufacturing a semiconductor device according to claim 1, wherein said metal ball is formed of at least one metallic material selected from the group consisting of Au, Al, Pd, Pb, Sn, Cu, In, Bi, Ti and Ni.

9. A method for mounting a semiconductor device, comprising mounting a circuit board provided with a bump on an input/output terminal electrode to a semiconductor device by bonding the tip of said bump to said terminal electrode of said semiconductor device, wherein an impact load applied when said bump is brought into contact with said semiconductor device is smaller than a static load applied after said bump is brought into contact with said terminal electrode.

10. The method for mounting a semiconductor device according to claim 9, wherein the tip of said bump has a needle shape.

11. The method for mounting a semiconductor device according to claim 10, wherein said needle-shaped portion comprises a flat portion having a diameter of 40 µm or less.

12. The method for mounting a semiconductor device according to claim 9, wherein the tip of said bump has a spherical shape.

13. The method for mounting a semiconductor device according to claim 9, wherein the terminal electrode of said semiconductor device is formed on the element or the wiring provided inside said semiconductor device.

14. The method for mounting a semiconductor device according to claim 9, wherein an ultrasonic wave is applied at least after said static load is applied.

15. The method for mounting a semiconductor device according to claim 9, wherein the impact load per said bump is 0.441 N or less, the static load is 0.981 N or less, the pressure applied to said terminal electrode after said static load is applied is 140 MPa or less.

16. The method for mounting a semiconductor device according to claim 9, wherein the difference between the impact load per said bump and said static load is 0.736 N or less.

17. The method for mounting a semiconductor device according to claim 9, wherein said bump is formed by a wire bonding method and formed of at least one metallic material selected from the group consisting of Au, Al, Pd, Pb, Sn, Cu, In, Bi, Ti and Ni.

18. The method for mounting a semiconductor device according to claim 9, wherein said bump is formed by plating and formed of at least one metallic material selected from the group consisting of Au, Al, Pd, Cu, Ni, Ti, Cr and Ag.

19. The method for mounting semiconductor electrode according to claim 9, wherein said bump is formed by a printing method and formed of at least one metallic material selected from the group consisting of Ag, Pd, Pt, Cu, Ni, Pb, Sn and Bi.

20. A method for inspecting a semiconductor device used for a method for manufacturing a semiconductor device by a wire bonding method using metal wire, wherein a probe needle for inspection is brought into contact with a region on said terminal electrode other than a region in which the metal ball formed at the tip of said metal wire by electric discharge is bonded to said terminal electrode among regions on the terminal electrode of the semiconductor device.

21. The method for inspecting a semiconductor device according to claim 20, wherein said terminal electrode is formed on the element or the wiring provided inside said semiconductor device.

* * * * *